United States Patent [19]

Flugan

[11] Patent Number: 4,649,348
[45] Date of Patent: Mar. 10, 1987

[54] RADIO FREQUENCY COILS FOR NUCLEAR MAGNETIC RESONANCE IMAGING SYSTEMS

[75] Inventor: David C. Flugan, Hudson, Ohio

[73] Assignee: Technicare Corporation, Cleveland, Ohio

[21] Appl. No.: 642,613

[22] Filed: Aug. 20, 1984

[51] Int. Cl.[4] ............................................. G01R 33/20
[52] U.S. Cl. .................................... 324/318; 324/309; 324/322
[58] Field of Search ............... 324/300, 307, 309, 318, 324/319, 320, 322

[56] References Cited

U.S. PATENT DOCUMENTS

| | | | |
|---|---|---|---|
| 4,015,196 | 3/1977 | Moore et al. | 324/309 |
| 4,021,726 | 5/1977 | Garroway | 324/309 |
| 4,051,429 | 9/1977 | Imanari . | |
| 4,075,552 | 2/1978 | Traficante | 324/322 |
| 4,115,730 | 9/1978 | Mansfield | 324/309 |
| 4,362,993 | 12/1982 | Young et al. | 324/309 |
| 4,408,162 | 10/1983 | Egger . | |
| 4,411,270 | 10/1983 | Damadian | 324/309 |
| 4,456,881 | 6/1984 | Compton . | |
| 4,467,282 | 8/1984 | Siebold | 324/318 |

FOREIGN PATENT DOCUMENTS 2056086 8/1979 United Kingdom .

OTHER PUBLICATIONS

D. I. Holt, "The NMR Receiver: A Description and Analysis of Design," Prog in NMR Spec., vol. 12, (1978), Part I, p. 41 et seq.

Primary Examiner—Michael J. Tokar
Attorney, Agent, or Firm—W. Brinton Yorks, Jr.

[57] ABSTRACT

A family of high Q radio frequency coils for an NMR imaging system is provided. The coil family includes a transmitting coil for transmitting an r.f. field aligned with a given plane. The transmitting coil is used with one of the described receiving coils, each of which is responsive to NMR signals in a plane oriented orthogonally to said given plane. The receiving coils employ an open, arcuate configuration, which alleviates sensations of confinement characteristic of fully enclosing coil forms. Arcuate sections of the receiving coils are curved away from the patient, to decrease signal reception at areas from which meaningful signals cannot be gathered. To prevent interaction between the transmitting and receiving coils, means are provided for rendering each coil nonresponsive to NMR and radio signal frequencies when the coils are not being operated.

17 Claims, 14 Drawing Figures

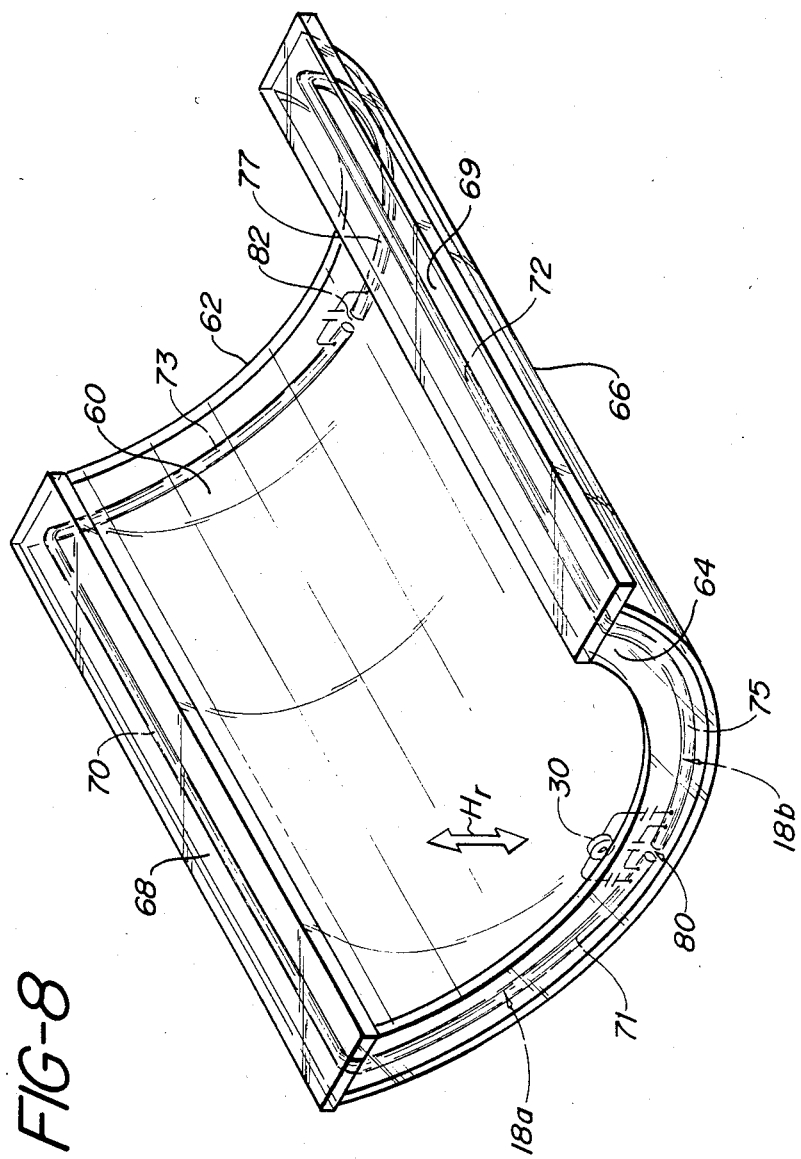

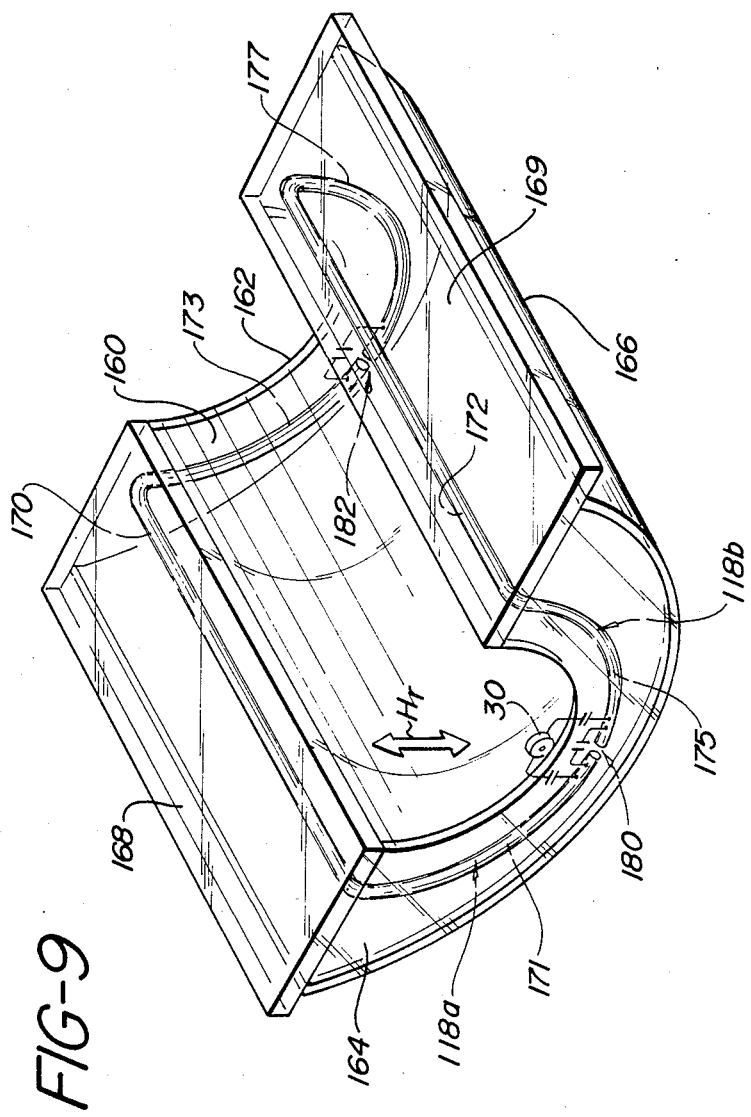

RADIO FREQUENCY COILS FOR NUCLEAR MAGNETIC RESONANCE IMAGING SYSTEMS

This invention relates to nuclear magnetic resonance imaging systems and, in particular, to a family of radio frequency (r.f.) coils and associated circuitry for inducing and detecting nuclear magnetic resonance (NMR) signals in a subject being imaged.

In an NMR imaging system, r.f. signals are used to excite the nuclei of a subject in the presence of a static magnetic field. During excitation, the moments of spinning nuclei which are aligned with the static magnetic field are reoriented, or "tipped", into a different directional orientation, from which they will subsequently emit detectable r.f. signals. The excitation may be done selectively; that is, through the simultaneous application of gradient r.f. fields to the subject, only those nuclei located in a specific spatial plane or planes of the subject will be subject to a magnetic field which matches, or creates resonance in response to, the frequencies of the applied r.f. excitation signals. Through application of additional magnetic field gradients, the spins of nuclei in the selected plane or planes can be spatially encoded in several dimensions so that the detected NMR signals can be processed to form an image of a plane or planes of the subject.

It is desirable for the r.f. coil that is receiving the NMR signals emitted by the tipped nuclei to exhibit a high Q, for maximum sensitivity to the NMR signals. An NMR imaging system with these r.f. signal characteristics will desirably exhibit a high signal to noise ratio.

It is further desirable that the r.f. field developed during excitation be highly uniform. A highly homogenous r.f. field will cause the selected nuclei to be uniformly tipped into the desired orientation. Without this tip angle uniformity, artifacts will be present in the resulting NMR images. It is also advantageous if field uniformity can be achieved without concentrating r.f. energy in a small region of a living subject.

In accordance with the principles of the present invention, an r.f. coil arrangement for an NMR imaging system is provided. In the coil arrangement, r.f. excitation signals are developed using a dedicated transmitting r.f. coil. The transmitting body coil develops a substantially homogenous r.f. field throughout a volume of the subject greater than the selected region from which NMR signals are to be received. This volumetric characteristic of the r.f. field prevents the concentration of r.f. energy in a small region of the subject.

The emitted NMR signals are detected by a separate r.f. coil dedicated to reception. The receiving r.f. coil detects NMR signals emitted from a selected region of the subject, and is a high Q tuned coil. In the preferred embodiments, body and head receiving coils are described.

High Q coils, however, are subject during use to being responsive to nearby structures with which they can electrically and magnetically interact. This interaction can result in a detuning of the coil and hence loss of the high Q characteristic. In particular, the transmitting and receiving coils can interact with and detune each other. In accordance with an aspect of the present invention, the transmitting and receiving coils are physically located so that their respective r.f. fields are oriented at right angles to each other, thereby substantially preventing the undesired interaction. In the preferred embodiments, the r.f. field of the transmitting coil exhibits a horizontal orientation, and the r.f. field of the receiving coil exhibits a vertical orientation.

However, in practical applications, the maintenance of an exact orthogonal relationship between the two r.f. fields is often difficult to achieve and maintain. Hence, some degree of undesirable coil interaction is to be expected. In accordance with a further aspect of the present invention, the flow of substantial currents in a coil which is not being operated is prevented. In a first embodiment, a coil which is not being operated is selectively connected to a high impedance, which prevents the flow of substantial currents in the coil. In a second embodiment, a coil is selectively detuned away from resonance when it is not being operated. In an illustrated embodiment, such detuning is accomplished by applying either a high impedance or a low, detuning impedance across the coil.

Figure 1:
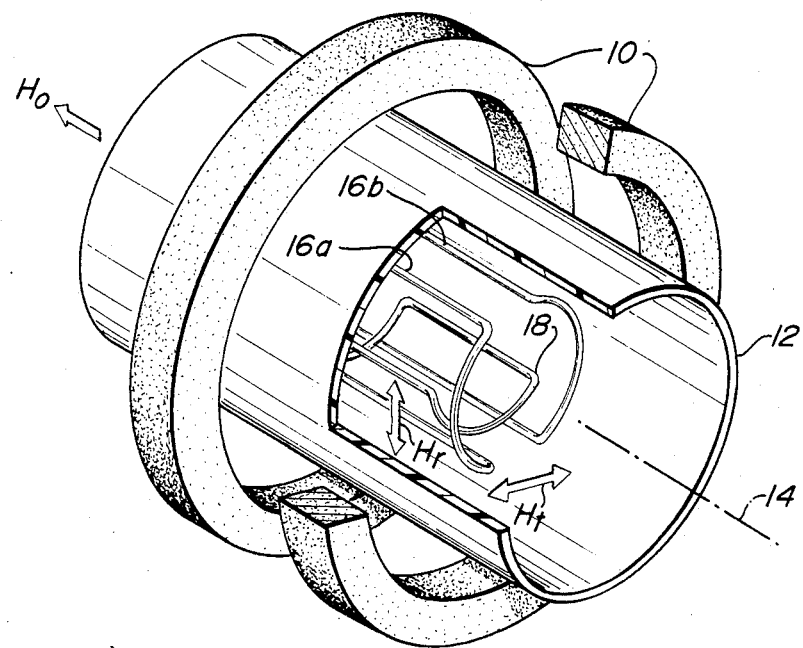
FIG. 1 illustrates an NMR imaging system constructed in accordance with the principles of the present invention.
Figure 10:
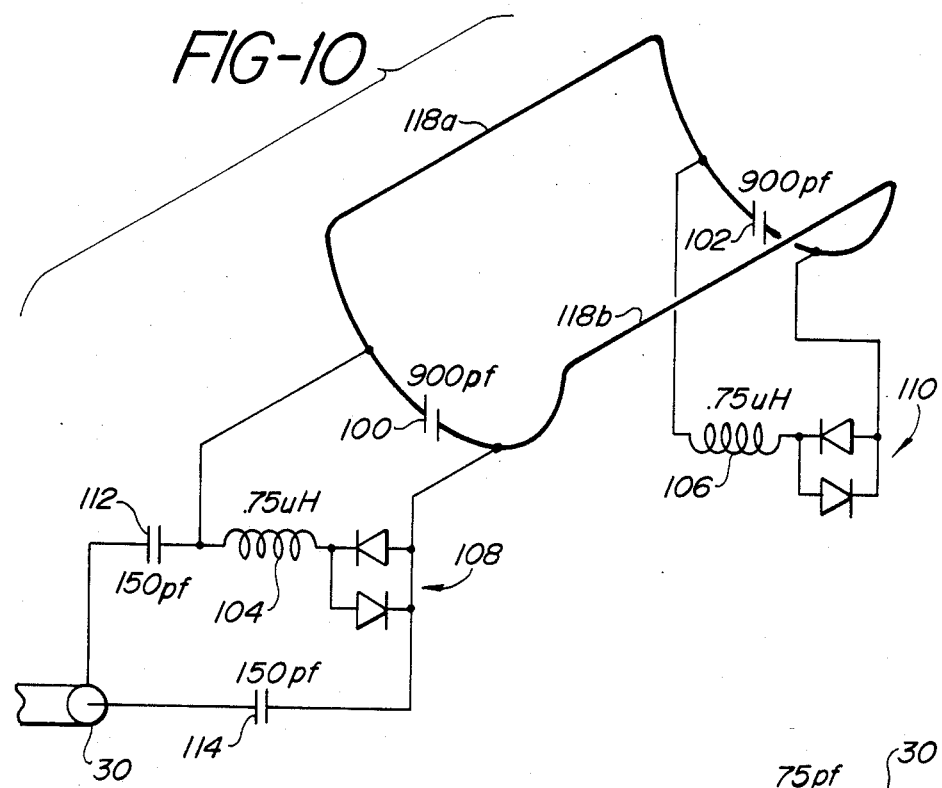
Figure 11:
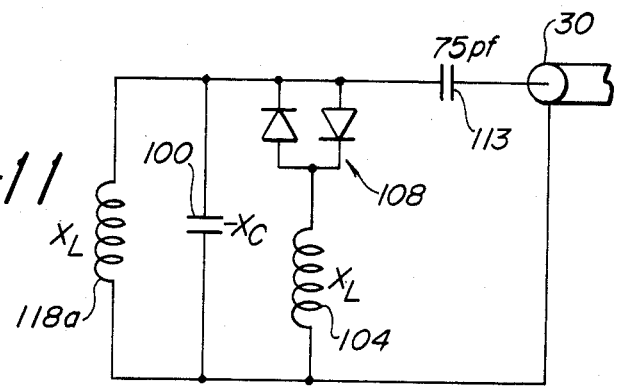
Figure 12:
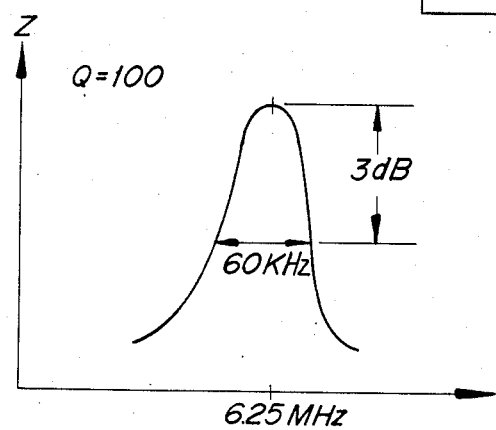

FIG. 8 illusttates a body coil suitable for use in the arrangement of FIG. 1;

FIG. 9 illustrates a head coil suitable for use in the arrangement of FIG. 1;

FIGS. 10 and 11 illustrate circuitry for use with the receiving coils of FIGS. 8 and 9; and FIG. 12 illustrates the response characteristic of a high Q coil.

Referring first to FIG. 1, an NMR imaging system constructed in accordance with the principles of the present invention is shown. The system includes a magnet 10, which may be a resistive or superconducting magnet, and creates a static magnetic field $H_o$. By virtue of the cylindrical shape and orientation of the magnet, the $H_o$ static field is directed horizontally in line with the bore through the center of the magnet 10. An axis 14 extends through the center of the magnet bore, and is taken as the z axis of the three-dimensional space inside the magnet bore.

Inside the magnet bore is a cylindrical coil form 12 made of a nonferrous material. Gradient coils for the x, y, and z directions are wound about the coil form 12. For clarity of illustration the gradient coils are not shown in FIG. 1. These gradient coils may be configured about the coil form 12 as described in U.S. Pat. No. 4,456,881 entitled "GRADIENT COIL APPARATUS FOR A MAGNETIC RESONANCE SYSTEM".

In accordance with the principles of the present invention, a transmitting r.f. coil and a receiving r.f. coil are located inside the coil form 12. The transmitting coil is composed of two vertically oriented saddle-shaped coils 16a and 16b which oppose each other in a cylindrical configuration. Each coil 16a and 16b has curved end coil segments which each circumscribe an arc of approximately 120 degrees. The horizontal straight coil segments which interconnect the curved end segments vertically oppose each other on each coil 16a and 16b. Thus, when energized, the transmitting coil will produce an r.f. field $H_t$ in the horizontal direction, orthogonal to the center axis 14 of the magnet as shown by the arrow indicated as $H_t$.

Located within the volume surrounded by coils 16a and 16b is a receiving coil 18. The receiving coil 18 is also saddle-shaped, and has curved end segments which circumscribe an arc chosen as a function of the specific region from which NMR signals are to be received. The horizontal straight coil segments which interconnect the curved end segments of the receiving coil 18 oppose each other in a horizontal plane. The receiving coil 18 thus exhibits an r.f. field $H_r$ for received signals which is vertically oriented, as indicated by the arrow designated $H_r$.

The transmitting and receiving coils are operated in alternating fashion, first transmitting then receiving. Interaction between the two coils is undesirable for several reasons. First, the transmitting coil is to develop a homogenous r.f. field throughout the subject being imaged. The reception of transmitted r.f. energy by the receiving coil is wasteful of transmitted energy, and could lead to the generation of artifacts through the creation of eddy currents in the receiving coil. Similarly, the receiving coil should receive the maximal amount of NMR signal energy emitted by the imaged subject. The reception of NMR signals is accordingly reduced if some of this signal energy is coupled from the receiving coil to the transmitting coil and then dissipated in the transmitting coil. Furthermore, if the coils are not precisely orthogonally aligned, Johnson noise generated in the transmitting coil through thermal agitation will be coupled to the receiving coil, and will reduce the signal to noise ratio.

Such undesirable interaction between the two coils is prevented by the orthogonal relationship between the planes of the coil segments and the resulting orthogonal relation of the transmitting and receiving fields $H_t$ and $H_r$. So long as this orthogonality is maintained, there will be substantially no interaction between the two coils. However, the precise orthogonal positioning of the coils necessary to prevent interaction may not always exist. This is particularly true when different receiving coils for different imaging techniques are placed in and taken out of the system. In accordance with the principles of the present invention, positional errors arising during such exchange of receiving coils are prevented from adversely affecting imaging as discussed below.

Figure 2:
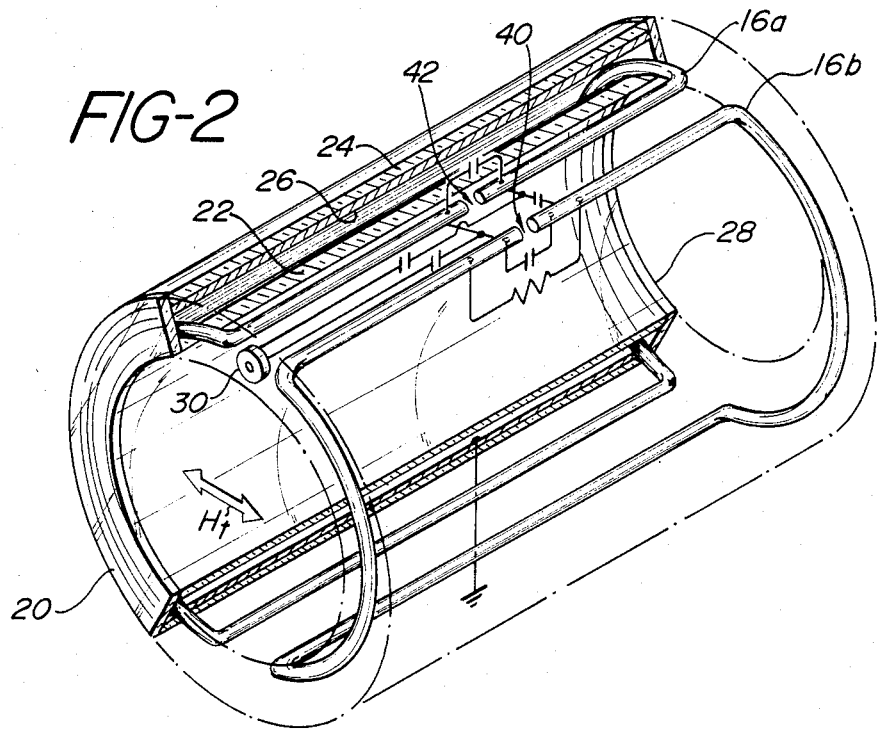
FIG. 2 illustrates a transmitting coil suitable for use in the arrangement of FIG. 1.

Referring to FIG. 2, a preferred embodiment of the transmitting coil of FIG. 1 is shown. The transmitting coils 16a and 16b are mounted in the hollow walls of a nonferrous polypropylene cylinder. The cylinder includes an outer wall 24 and an inner wall 22, with ring-shaped end caps 20 and 28 fitted on the ends of the cylinder. The transmitting coils are comprised of hollow five-eighths inch diameter copper tubes. The straight tube segments at the top are broken in the middle to break the eddy current paths otherwise provided by the coil loops. The coil tubes are mounted to the outer surface of the inner wall 22 by nylon straps adhesively affixed to the wall surface.

The inner surface of the outer wall 24 is covered with a sheet of copper 26. The copper sheet is grounded and acts to isolate the r.f. signals of the system from the gradient coils around the coil form 12 of FIG. 1. Without this isolation the emitted NMR signals could be dissipated by interaction with the gradient coils and r.f. noise from the gradient coils could be introduced into the r.f. fields. This isolation also prevents the transmission of r.f. signals into the gradient windings from the transmitting coil.

Located across the gaps 40 and 42 of the coil tubes are tuning capacitors, which will be described further in conjunction with FIGS. 3 and 4. Detuning resistors, one of which is shown in FIG. 2, may also be mounted across the gaps 40 and 42 to "spoil" the Q of the coils. In some experiments such as multislice imaging, a broader band transmitted signal may be desired. In such cases detuning resistors can be used to spoil the Q for the production of a broader frequency response characteristic.

The coils are energized through an r.f. connector 30 mounted on end cap 20. The r.f. connector 30 is connected to the coils as shown in schematic detail in FIGS. 3 and 4. Referring first to FIG. 3, a back-to-back diode switch 32 is coupled in series with the center terminal of the connector 30. An inductor 50 and an adjustable tuning capacitor 52 are coupled in parallel between the diode switch 32 and the remaining connector terminal. Alternatively, the tuning capacitor 52 may be deleted and the circuit tuned by manually adjusting the airgap spacing between the turns of the inductor 50. Coupling capacitors 34 and 36 match the impedance of the coils (approximately 3000 ohms) to the 50 ohm impedance of the cable connecting the transmitter to the connector 30.

Tuning capacitors 44 and 47 of approximately 400 pf are connected across the gaps of coils 16a and 16b. Detuning resistors 46 and 49 are coupled in parallel with these capacitors. Capacitor 36 is coupled to one side of tuning capacitors 44 and 47, and capacitor 34 is coupled to the other side of the tuning capacitors. One of these connections is made using a capacitor 38 (approximately 20,000 pf) which is effectively a short circuit to r.f. signals. The purpose of capacitor 38 is to break the direct path of eddy currents resulting from gradient fields which would otherwise be formed by the interconnection of the two coils.

Figure 3:
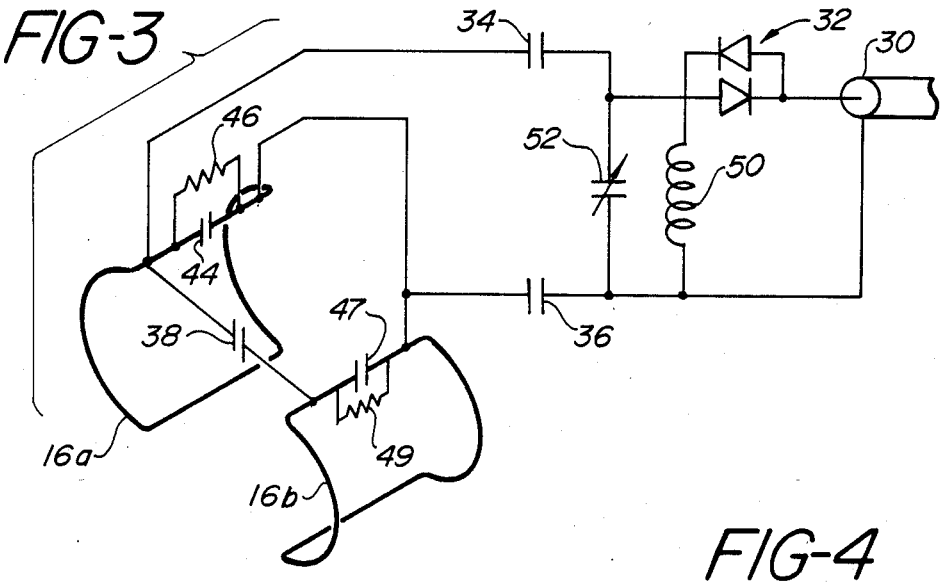
FIG. 3 illustrates circuitry for operating the transmitting coil of FIG. 1.
Figure 4:
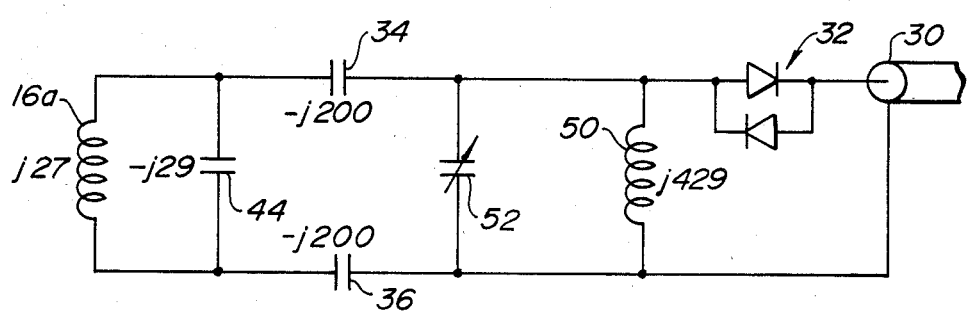
FIGS. 4, 5a and 5b illustrate in schematic form the circuitry of FIG. 3.

The arrangement of FIG. 3 is shown in more conventional schematic diagram form in FIG. 4. For ease of illustration only one coil 16a and tuning capacitor 44 are shown in FIG. 4. Impedance values are reactively shown using the familiar expressions $Z_C = -1/j\omega C$ and $Z_L = j\omega L$. The circuit of FIG. 4 energizes the tuned circuit 16a and 44 by driving it in a balanced configuration through capacitors 34 and 36. When energized in this manner a peak voltage of approximately +5000 volts appears at one end of the tuned circuit and approximately −5000 volts is developed at the other end. Thus, the capacitors 34 and 36 need to withstand these peak voltages. The circuit could be configured by using only one capacitor of an impedance value of −j400 in place of capacitor 34 with capacitor 36 eliminated from the circuit. This configuration, however, would result in peak voltages of about +10,000 volts being developed at the junction of capacitor 34 and the resonant circuit, and accordingly necessitates the use of a higher voltage, more expensive capacitor. The balanced configuration is hence the preferred embodiment.

Figure 5A:
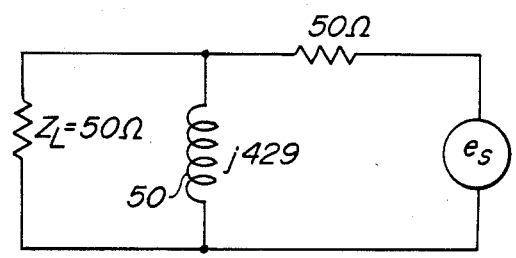
Figure 5B:
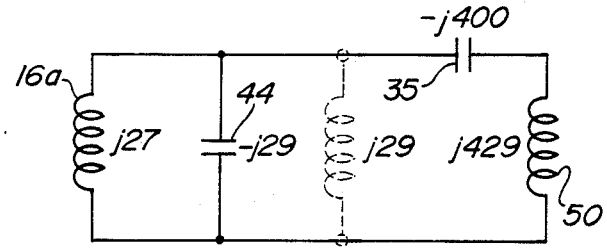

The circuit of FIG. 4 has two modes of operation, which are representatively shown in FIGS. 5a and 5b. The transmit mode is shown in FIG. 5a. In this mode the transmitter signal $e_s$ is applied by way of a 50 ohm source impedance, energizing a 50 ohm load. The diode switch 32 is strongly forward biased during transmission and exhibits an impedance of less than one ohm;

hence, it is effectively a short circuit and does not appear in FIG. 5a. Inductor 50, however, is coupled across the resonant 50 ohm load. The inductive reactance of inductor 50 is approximately 429 ohms. This is large compared to the 50 ohm source impedance and the 50 ohm load. Thus, inductor 50 essentially plays no part in the circuit due to this impedance difference.

In the receive mode representatively shown in FIG. 5b, the transmitter is turned off while the receiving coil performs its part in the NMR imaging sequence. If the transmitting and receiving coils are in the precise orthogonal relationship, there will be no significant interaction between the two coils. However, if precise orthogonality has not been achieved, some of the NMR signal energy emitted by the subject will be received and dissipated by the transmitting coil, and Johnson noise may be picked up in the receiving coil from the transmitting coil. In accordance with the principles of the present invention, the circuit of FIG. 4 significantly reduces currents flowing in the transmitting coil during signal reception by the receiving coil. With the transmitter turned off, the diode switch is open, and presents a high impedance of several thousand ohms to the circuit. The 50 ohm source impedance is thus removed from the circuit. Capacitors 34 and 36 are representatively shown in FIG. 5b by a single $-j400$ capacitor 35. The combined effect of capacitor 35 and inductor 50 is the sum of their reactive impedances ($-j400+j429$), or a net inductive reactance of $j29$ in parallel with capacitor 44. This net inductive reactance will resonate with the capacitive reactance ($-j29$) of capacitor 44 to produce a high impedance across coil 16a at its resonant frequency. Since coil 16a is now connected to a high impedance instead of a resonating capacitor, no significant current flows will occur in the coil, and the transmitting coil is disabled from interfering with the receiving coil. The adjustable capacitor 52 is used to "subtract" capacitive reactance from the inductive reactance of inductor 50 in the final adjustment of the circuit.

Figure 6:
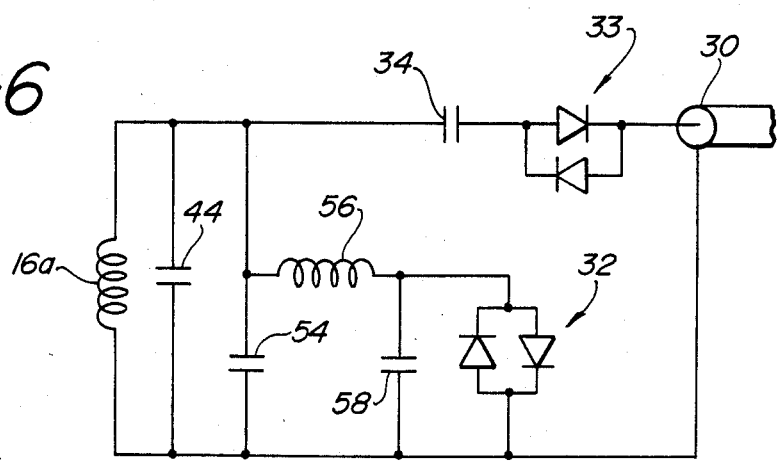
FIGS. 6, 7a and 7b illustrate alternative circuiting for use with the transmitting coil of FIG. 2.
Figure 7A:
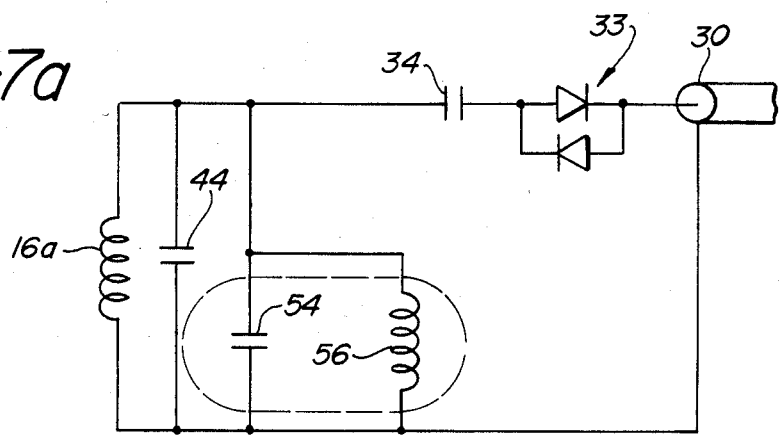
Figure 7B:
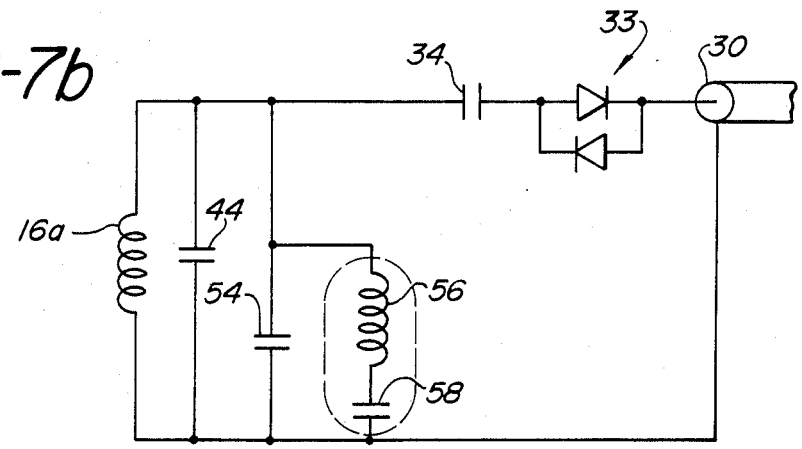

An alternate circuit for disabling the transmitting coil during receiving is shown in FIGS. 6, 7a, and 7b. In FIG. 6, a capacitor 54 is coupled in parallel with the resonant circuit 16a and 44. An inductor 56 and a capacitor 58 are coupled across capacitor 54, and diode switch 32 is coupled in parallel with capacitor 58. Capacitor 34 is an impedance matching capacitor coupled between connector 30 and the resonant circuit. A diode switch 33 is coupled between capacitor 34 and connector 30.

Effective operation of the arrangement of FIG. 6 is representatively shown in FIGS. 7a and 7b for the transmit and receive modes. During transmit, the diode switch 32 effectively short-circuits capacitor 58. Inductor 56 then forms a parallel resonant circuit with capacitor 54 as shown in FIG. 7a. The parallel resonant circuit presents a high impedance across the resonant circuit consisting of the coil 16a and tuning capacitor 44. The high impedance of the parallel resonant circuit 54, 56 has substantially no effect on operation of the coil resonant circuit 16a and 44 during transmission.

During the receive mode, representatively shown in FIG. 7b, the diode switches 32 and 33 are open, and inductor 56 and capacitor 58 effectively form a series tuned circuit across capacitors 44, 54 and coil 16a. This condition occurs when the reactive impedance $X_L$ of indicator 56 equals the reactive impedance $-X_C$ of capacitor 58. The series tuned circuit presents a low impedance across the coil, which detunes the coil 16a away from its resonant frequency. With the coil 16a detuned away from the NMR signal frequencies of the receiving coil, the transmit coil will have no significant effect upon the receiving coil, as the coil 16a will only exhibit its inherent inductive reactance at the NMR signal frequencies.

Another way to view FIG. 7b, for the condition where the inductive reactance of inductor 56 exceeds the capacitive reactance of capacitor 58, is to consider the combined effect of inductor 56 and capacitor 58 to be a net inductive reactance. This net inductive reactance is in parallel with the parallel capacitive reactances of capacitors 44 and 54, thereby forming a parallel resonant circuit. As in the case of the arrangement of FIG. 5b, coil 16a sees a high impedance parallel resonant circuit coupled across its terminals. Thus, significant currents are inhibited from flowing in the coil.

The arrangement of FIG. 4 is advantageous in that it requires fewer components than the arrangement of FIG. 6. The arrangement of FIG. 6 is advantageous in that it avoids the careful balancing of capacitive and inductive reactances needed in the precise tuning of the arrangement of FIG. 4.

In a constructed embodiment of the present invention, the transmitting coil structure of FIG. 2 is fitted inside the bore of the magnet and gradient coil form. A patient pallet then slides into and out of the cylindrical opening of the transmitting coil structure. Receiving coil structures shown in FIGS. 8 and 9 are placed in the pallet, with the region of the patient to be imaged resting on them. The pallet, patient and receiving coil then slide into the magnet and r.f. coil opening for imaging, with the respective positions of the coils as illustrated in FIG. 1.

Referring now to FIG. 8, a receiving coil designed to image the human body is shown. The coil 18a, 18b is mounted in a hollow arcuate polypropylene coil form which subtends an arc of approximately 125 degrees. The coil form includes an inner arcuate surface 60, an outer arcuate surface 66, curved end caps 62 and 64, and shoulder pieces 68 and 69. A constructed embodiment of the coil form measures about seventeen inches long from end cap to end cap, and about seventeen inches from the inner edge of one shoulder piece to the other. The coil form is about five inches deep. The outer arcuate surface 66 is curved to fit into the similarly shaped patient pallet and the shoulder pieces 68 and 69 extend beyond the outer surface on either side of the coil form so as to overlap the edges of the patient pallet, thereby retaining the body coil in its desired position.

The five-eighths inch copper tube coil is composed of two straight segments 70 and 72, and curved segments 71 and 75 at one end and curved segments 73 and 77 at the other end. The respective pairs of curved segments are separated by gaps 80 and 82, across which the tuning capacitors for the coil are coupled. The gaps break the eddy current path otherwise formed by the coil loop and also make bending of the copper tubing in two pieces 18a and 18b more convenient during construction. An r.f. connector 30 is mounted on one end cap 64 and couples received signals from the coil to a cable.

The coil 18a, 18b is mounted inside the hollow coil form by nylon straps which are adhesively fixed to the inner sides of the coil form surfaces. The straight coil segments 70 and 72 are secured against the inner side of surface 60, in close proximity to a patient resting in the coil form. By the right hand rule, the field lines of the $H_r$ field extend vertically from these segments in the concave space where the patient is located. This is the desired field orientation, and hence the straight coil segments are located close to the patient for reception of maximal signal.

By the right hand rule, the field lines above the curved segments 71, 75 and 73, 77 in the vicinity of gaps 80 and 82 run horizontally in the space above the curved segments. These field lines are in the direction of the static $H_o$ field, from which the receiver is intended to gather no signal. Imaged areas directly above the gaps will thus appear as dead areas in the NMR image. Moreover, any signals received from these regions will constitute noise which can deleteriously affect the signal to noise characteristic of the image. Accordingly, it is desirable to reduce signal reception from these areas. This reduction is accomplished by curving the segments away from inner surface 60 as the segments extend down toward the gaps 80 and 82. The curved segments are then strapped in place against the insides of the end caps 62 and 64. The right hand rule further demonstrates that the field lines in lateral (i.e. horizontal) directions from the curved segments are substantially vertical, the desired field direction. These laterally located areas are more distant from the segments than the areas above the gaps in any event, and desired signal reception from these laterally located areas is not substantially affected by the extended vertical curvature of the segments 71, 75 and 73, 77.

A receiving coil for the head is shown in FIG. 9. Like the body coil, the head coil is mounted in a coil form which fits into the patient pallet. In the prior art, head coils were constructed in cylindrical coil forms which completely surround the head of the patient. Such head coils can give the patient a strong sense of confinement and elaborate measures, such as canted mirrors in the coil form, have been taken to relieve this sensation. The head coil of the present invention obviates the need for such measures, since it is completely open at the top and subtends an arc about the head of only 180 degrees.

The coil form for the head coil comprises an inner arcuate surface 160, an outer arcuate surface 166, end caps 162 and 164, and shoulder pieces 168 and 169. As in the body coil, the outer surface 166 is formed to fit in the patient pallet, and the shoulder pieces 168 and 169 extend over the edges of the pallet. The concave opening for the head is about 9¼ inches in diameter and the coil form is about twelve inches long from end cap to end cap.

For the same reasons as given for the body coil, the head coil copper tubing is formed in two pieces 118a and 118b separated by gaps 180 and 182, across which the tuning capacitors are coupled. Electrical connection to the coil is made by way of an r.f. connector 30 mounted on one end cap 164. The straight coil segments 170 and 172 are strapped to the inside of inner surface 160. The curved segments 171, 175 and 173, 177 curve away from the inner surface 160 as they extend downward from the straight segments, and are strapped to the insides of the end caps 162 and 164.

The circuitry for the receiving coils is shown in FIG. 10. The illustrated embodiment of FIG. 10 shows values for the head coil; the body coil values are slightly different, with the tuning capacitors for the body coil having values of 1000 pf, for instance. In FIG. 10, the two conductors of the r.f. connector 30 are coupled to coils 118a and 118b by impedance matching capacitors 112 and 114 so that the connector may be connected to 50 ohm cable. Tuning capacitors 100 and 102 are coupled across the coils. An inductor 104 or 106 and a diode switch 108 or 110, respectively, are coupled across each tuning capacitor.

The arrangement of FIG. 10 is drawn in more familiar schematic diagram form in FIG. 11. In this FIGURE, the balanced capacitors 112, 114 of FIG. 10 are replaced with the alternative single capacitor 113, and only one-half of the parallel coil and circuit configuration is shown for ease of illustration.

When the coil is receiving NMR signals from the subject being imaged, only very small voltages are developed across the coil 118a and its tuning capacitor 110, which are resonant at the frequency of the NMR signals. These small signal voltages are insufficient to forward bias the diode switch 108, and inductor 104 is effectively removed from the circuit and has no effect on its operation. But when the transmitting coil is transmitting r.f. signals and the receiving coil is inoperative, a slight misalignment of the desired orthogonal relationship between the transmitting and receiving coils can cause interaction between the two coils. During this time, the receiving coil is to be disabled to prevent this undesired interaction. As the interaction begins, signal voltages will be induced in the receiving coil until a sufficient level is reached so that the diode switch 108 becomes conductive. The inductor 104 is now operatively connected in the circuit, and will resonate with the tuning capacitor 100 and the capacitor 113. This resonant circuit 100, 104 and 113 produces a high impedance at the r.f. signal frequency, which high impedance is coupled across the coil 118a. Since the coil 118a is now coupled to a high impedance, no significant currents can flow in the coil 118a, and it is effectively disabled from affecting the performance of the transmitting coil. In a constructed embodiment, the inductive reactance of inductor 104 was chosen to match the inductive reactance of the coil 118a.

Since the receiving coils are located inside the shielded transmitting coil during operation, the grounded copper shield 26 will isolate the receiving coils from r.f. interference produced by the gradient coils and from NMR signal pickup by the gradient coils.

Because the coils of the present invention do not detrimentally interact with one another when misaligned from the orthogonal relationship, the receiving coils may be quickly and easily interchanged without the need for careful, time-consuming realignment. The ease of system operation is enhanced thereby.

What is claimed is:

1. Nuclear magnetic resonance imaging apparatus comprising:
   a magnet for producing a static magnetic field;
   means for producing a field gradient with respect to said static magnetic field;
   a radio frequency transmitting coil for developing magnetic resonance signals in a region within said static magnetic field;
   a radio frequency receiving coil for receiving magnetic resonance signals developed in said region; and
   means, coupled to said radio frequency transmitting coil and responsive to the induction of current in said transmitting coil during the reception of magnetic resonance signals by said receiving coil, for selectively connecting an impedance to said transmitting coil for rendering said radio frequency transmitting coil substantially unresponsive to reception of said magnetic resonance signals.

2. Nuclear magnetic resonance imaging apparatus according in claim 1, further comprising:
   means for rendering said radio frequency receiving coil substantially unresponsive to signals transmitted by said radio frequency transmitting coil.

3. Nuclear magnetic resonance imaging apparatus comprising:
   a magnet for producing a static magnetic field;
   means for producing a field gradient with respect to said static magnetic field;
   a radio frequency transmitting coil for developing magnetic resonance signals in a region within said static magnetic field;
   a radio frequency receiving coil for receiving magnetic resonance signals developed in said region; and
   means, coupled to said radio frequency receiving coil and responsive to the induction of current in said receiving coil during transmission by said transmitting coil, for selectively connecting an impedance to said receiving coil for rendering said radio frequency receiving coil substantially unresponsive to signals transmitted by said radio frequency transmitting coil.

4. Nuclear magnetic resonance imaging apparatus according to claim 1, 2, or 3, wherein said radio frequency transmitting coil produces an r.f. field oriented substantially parallel to a first plane ; and
   wherein said radio frequency receiving coil is responsive to an r.f. field oriented substantially orthogonal to said first plane.

5. Nuclear magnetic resonance imaging apparatus according to claim 1, 2, or 3, wherein said means for selectively connecting comprises means for selectively connecting a high impedance to said coil being made unresponsive to impede the flow of induced current.

6. Nuclear magnetic resonance imaging apparatus according to claim 5, wherein said coil being rendered unresponsive is tuned for resonance about a given magnetic resonant frequency, and wherein said means for selectively connecting comprises means for selectively connecting a high impedance at said magnetic resonance frequency across said coil being made unresponsive.

7. Nuclear magnetic resonance imaging apparatus according to claim 6, wherein said means for selectively connecting includes a switch.

8. Nuclear magnetic resonance imaging apparatus according to claim 7, wherein said switch comprises a diode switch.

9. Nuclear magnetic resonance imaging apparatus according to claim 1, wherein said transmitting coil is tuned for transmission about a given magnetic resonant frequency; and further comprising a source of transmit signals; wherein said means for selectively connecting comprises a diode switch and a reactive impedance element coupled between said transmit signal source and said tuned transmitting coil, said diode switch being forward biased during transmission, and substantially nonconductive when said transmitting coil is not transmitting.

10. Nuclear magnetic resonance imaging apparatus according to claim 9, wherein said tuned transmitting coil includes a capacitor; said reactive impedance element comprises an inductor coupled across said capacitor, said inductor forming a resonant circuit with said capacitor when said diode switch is substantially nonconductive to present a high impedance to said transmitting coil at said magnetic resonant frequency.

11. Nuclear magnetic resonance imaging apparatus according to claim 9, wherein said means for selectively connecting includes a second reactive impedance element coupled to said first-named reactive impedance element, said first-named and second reactive impedance elements forming a low impedance tuned circuit when said diode switch is substantially nonconductive so as to detune said transmitting coil away from said resonant frequency.

12. Nuclear magnetic resonance imaging apparatus according to claim 3, wherein said receiving coil is tuned for receiving magnetic resonance signals located about a given frequency; and further comprising a receiver; and wherein said means for selectively connecting comprises a diode switch and a reactive impedance element coupled between said tuned receiving coil and said receiver, said diode switch being substantially nonconductive when said receiving coil is receiving magnetic resonance signals from a subject being imaged, and selectively forward biased when said receiving coil is not receiving magnetic resonance signals.

13. Nuclear magnetic resonance imaging apparatus according to claim 12, wherein said tuned receiving coil includes a capacitor; and said reactive impedance element comprises an inductor which, when said diode switch is forward biased, forms a resonant circuit with said capacitor at said given frequency.

14. Nuclear magnetic resonance imaging apparatus according to claim 13, wherein said resonant circuit presents a high impedance to said receiving coil at said given frequency.

15. Nuclear magnetic resonance imaging apparatus according to claim 12, 13, or 14, wherein said diode switch is selectively forward biased by the reception by said receiving coil of r.f. signals transmitted by said transmitting coil.

16. A radio frequency receiving coil for a nuclear magnetic resonance imaging system, comprising a generally saddle-shaped coil and a coil form defining a volume for retaining said coil, said coil form defining a rigid concave patient supporting surface, said coil including at least one arcuate coil segment connecting two substantially straight coil segments, at least a portion of said arcuate segment extending further from said patient supporting surface than the extension of said straight coil segments from said patient supporting surface.

17. Nuclear magnetic resonance imaging apparatus according to claim 1, 2, or 3, wherein said coil being rendered unresponsive is tuned for resonance about a given magnetic resonant frequency, and wherein said means for selectively connecting comprises means for selectively connecting a low impedance across said coil being made unresponsive so as to detune said coil being made unresponsive away from said resonant frenquency.

* * * * *